United States Patent
Zimmerman et al.

(10) Patent No.: US 7,282,689 B2
(45) Date of Patent: Oct. 16, 2007

(54) OPTICAL FIBER RECEIVER HAVING AN INCREASED BANDWIDTH

(75) Inventors: Horst Zimmerman, Vienna (AT); Michael Foertsch, Vienna (AT); Holger Pless, Bienstaedt (DE)

(73) Assignee: Melexis GmbH, Erfurt (DE)

( * ) Notice: Subject to any disclaimer, the term of this patent is extended or adjusted under 35 U.S.C. 154(b) by 0 days.

(21) Appl. No.: 10/507,306

(22) PCT Filed: Mar. 24, 2003

(86) PCT No.: PCT/DE03/00969

§ 371 (c)(1), (2), (4) Date: May 4, 2005

(87) PCT Pub. No.: WO03/081813

PCT Pub. Date: Oct. 2, 2003

(65) Prior Publication Data

US 2006/0163452 A1    Jul. 27, 2006

(30) Foreign Application Priority Data

Mar. 22, 2002 (DE) ............... 102 13 045

(51) Int. Cl.
- *H01J 40/14* (2006.01)
- *H03F 3/08* (2006.01)
- *H04B 10/06* (2006.01)

(52) U.S. Cl. .............. 250/214 R; 250/214 A

(58) Field of Classification Search ............ 250/214.1, 250/214 R, 214 A, 214 LA; 330/59, 308; 398/202, 206, 208, 210, 214, 135

See application file for complete search history.

(56) References Cited

U.S. PATENT DOCUMENTS

| | | | | |
|---|---|---|---|---|
| 5,371,623 A | * | 12/1994 | Eastmond et al. | ............ 398/27 |
| 5,790,295 A | * | 8/1998 | Devon | .................. 398/202 |
| 6,392,219 B1 | * | 5/2002 | McCormick et al. | ... 250/214 R |
| 6,834,165 B2 | * | 12/2004 | Feng | ..................... 398/202 |
| 2002/0003649 A1 | | 1/2002 | Feng | |

FOREIGN PATENT DOCUMENTS

| | | |
|---|---|---|
| JP | 10038683 | 2/1998 |
| JP | 10164624 | 6/1998 |

OTHER PUBLICATIONS

H. Zimmermann, Monolithic Bipolar-, CMOS-, and BiCMOS-Receiver OEICs; CAS '96 Proceedings, vol. 1, 1996 International Semiconductor Conference, Oct. 9-12, 1996, Sinaia, Romania IEEE.

* cited by examiner

*Primary Examiner*—Georgia Epps
*Assistant Examiner*—Tony Ko
(74) *Attorney, Agent, or Firm*—Hunton & Williams LLP

(57) ABSTRACT

The invention relates to an optical fiber receiver (11) for optoelectronic integrated circuits (OEIC's) having an improved sensitivity and improved bandwidth. The improvements are achieved by subdividing the photodiodes into partial photodiodes (D1, D2), whereby each partial photodiode is connected to a respective transimpedance amplifier (20, 21), and the output signals of the individual transimpedance amplifiers are added inside a summation amplifier (30). The optical fiber received can be produced using different technologies: CMOS, BICMOS, BIPOLAR.

14 Claims, 3 Drawing Sheets section A-B
of Fig. 3

OPTICAL FIBER RECEIVER HAVING AN INCREASED BANDWIDTH

The invention concerns a (monolithic) integrated optical fibre receiver with an increased sensitivity and increased bandwidth.

Known optical fibre receivers consist primarily of a photodiode and of a transimpedance amplifier which converts the current from the photodiode into a proportional voltage. See, for instance, DE 32 33 146 (AT&T Technologies) or DE 33 38 024 (SEL AG). A decision circuit may also follow, whose task is to decide whether the light level being received corresponds to a logical zero or to a logical one. Optical fibres with larger diameters produce a light spot that is correspondingly large. When, for instance, plastic fibres are used, the spot of light that is to be received can be, relatively, very large (up to one millimetre in diameter). In order to be able to fully exploit the incoming light flux, the photosensitive surface of the receiving photo diode is correspondingly modified. However, with the increase in receptive area, the depletion layer capacitance of a photo diode also rises, resulting in a deterioration both of its speed and of the noise behaviour of the subsequent transimpedance amplifier.

A technical problem addressed by the invention is that of providing a relatively large light-sensitive receptive area for fast optical signals, and yet to increase the bandwidth and the sensitivity of the optical receiver.

This challenge is answered, in accordance with the invention, by dividing an optical receiver diode whose size has been adapted to that of the spot of light, and by following each individual partial photodiode with its own transimpedance amplifier. The output signals from the individual (separate) transimpedance amplifiers are integrated in a summing amplifier.

Because the partial photodiodes have a lower depletion layer capacitance than a larger diode whose area corresponds to the total, the individual transimpedance amplifiers have a wider bandwidth and a better noise behaviour. These properties are only insignificantly affected by the summing amplifier.

The principle of division of an optical receiver can also be implemented in bipolar and BICMOS OEICs. Due to the higher level of amplification, these can achieve data rates even higher than 622 Mbit/s with an effective diameter of have 1 mm for a photo diode.

These high data rates can for the first time be achieved with the aid of the photodiode division principle, in combination with an effective photodiode diameter of up to 1 mm. In this way an optoelectronic integrated circuit (OEIC) for a plastic fibre with a diameter of around 1 mm can achieve a data rate of more than 500 Mbit/s.

A further possible application lies with optical receivers for glass fibres or for plastic fibres that permit a high tolerance in the adjustment of plug-in optical connectors, or which do not require adjustment.

The invention will be explained with the aid of example implementations. All the elements illustrated should be a understood as having been manufactured by integrating them onto one chip in CMOS technology, unless described otherwise.

Figure 1:
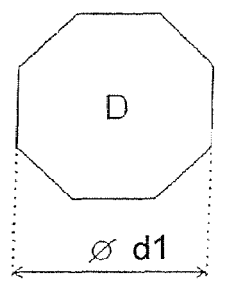
FIG. 1 shows a view from above of a photodiode in an optical fibre receiver according to the prior art (schematic).

The full-area photodiode D in FIG. 1, manufactured in 0.6 pm CMOS technology, has a diameter "dl" of 400 pm and a depletion layer capacitance of about 1.6 pF. The four partial photodiodes D1, D2, D3 and D4 in FIG. 3 (each) have a depletion layer capacitance of 400 fF. An electrical contact 10 to the photodiodes to the rear of the substrate (see FIG. 5 with section A-B from FIG. 3) considerably reduces the series resistance of the PIN diodes.

Figure 2:
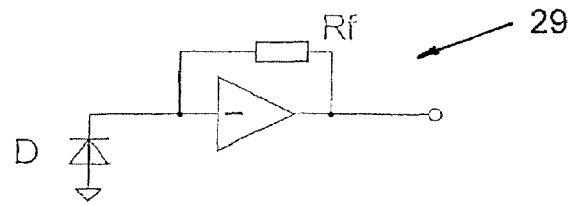
FIG. 2 shows the circuit of a photodiode with a transimpedance amplifier 29.
Figure 3:
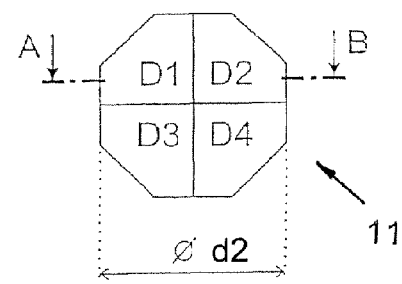
FIG. 3 shows a view from above of a photodiode in an example of the optical fibre receiver in accordance with the invention (schematic).
Figure 4:
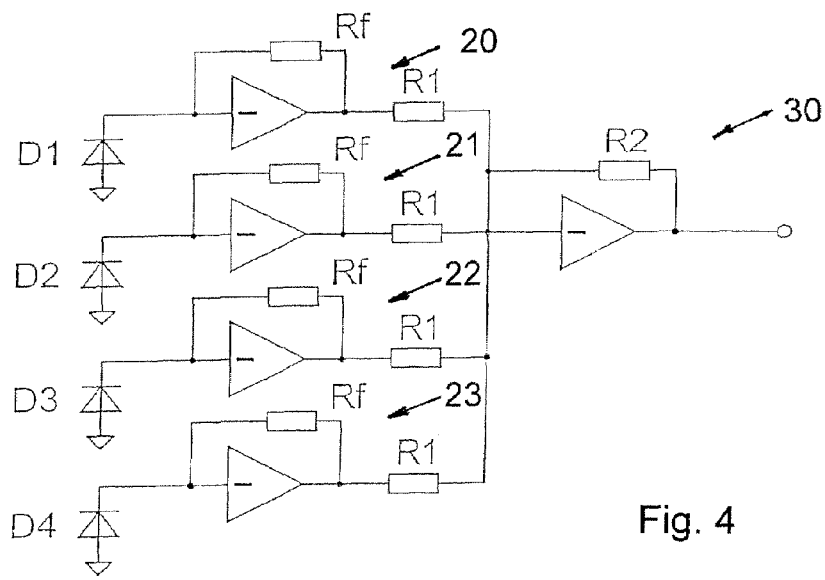
FIG. 4 shows a circuit in accordance with the invention with partial photodiodes and with a number of transimpedance amplifiers and the summing amplifier.

The transimpedance amplifiers 20 to 23 in accordance with FIG. 4 have a transimpedance of 70 kOhm, while the summing amplifier 30 has an amplification factor of 2.5. The bandwidth of the transimpedance amplifier 29 associated with the full-area photodiode D according to FIGS. 1 and 2 is 151 MHz, while that of the total system involving four divided photodiodes 11 in accordance with FIGS. 3 and 4 having the same receiver area is 402 MHz.

The transimpedance of the total system with four divided photodiodes in accordance with FIG. 4 is 164 kOhm.

The electrical circuitry connecting the individual photodiodes D1 to D4 can be seen in FIG. 4. One of the amplifiers 20 to 23 is allocated to each of the partial diodes and accepts its electrical output signal. Through a circuit configuration as current-voltage converters with feedback resistance Rf, each of the individual transimpedance amplifiers is responsible for one partial diode. The output signals are not illustrated separately, but are present at the input resistor R1 of the summing circuit 30, which, through its feedback resistor R2, determines the amplification factor of the summing circuit. In the illustration above, this has been selected to be 2.5.

Figure 5:
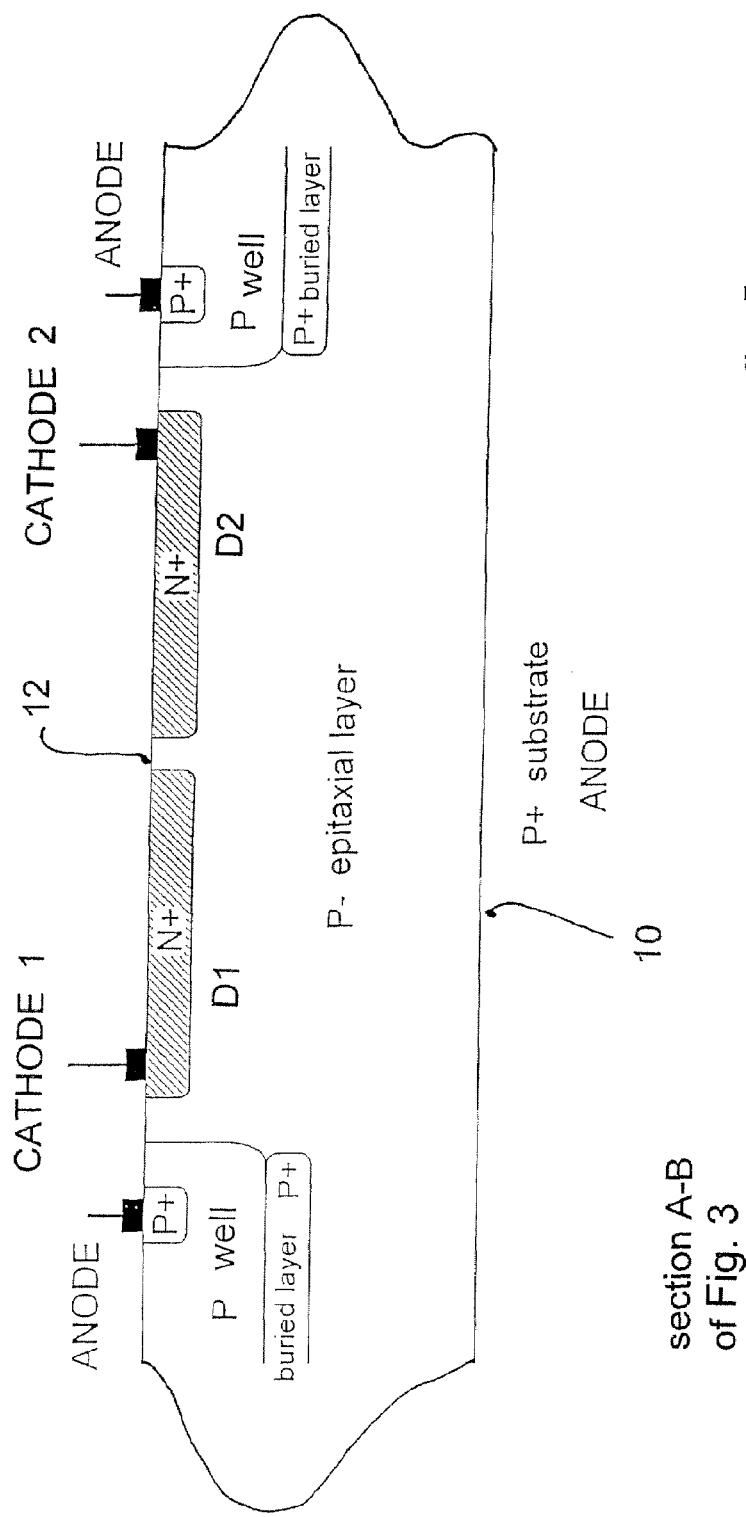
FIG. 5 is a vertical section through the PIN photodiode according to FIG. 3 (schematic).

The structure of the individual diodes in accordance with FIG. 3 can be seen in the sectional diagram of FIG. 5. The two photodiodes D1 and D2 seen through section A-B appear as Photodiode 1 and Photodiode 2, and their N+ regions are separated by a narrow strip 12. This cathode region is unique for each photodiode, and is connected to the associated amplifier in accordance with FIG. 4. The relevant anode connection of a partial diode is made to the P+ region above the P well and the buried P+ layer in the epitaxial layer, and on the both sides of the N+ layer of each photodiode D1 and D2. The anodes can be connected to ground.

A further anode 10 on the rear of the substrate can significantly reduce the series resistance of the diodes. FIG. 5 is only a section of an integrated circuit which can extend further to the left and to the right, in particular including integrated circuit amplifiers as they are indicated on FIG. 4, or also further optical fibre receivers. Each optical fibre receiver here is coupled through an electrical plug-in connector to an optical fibre—not shown—in order to project a light spot from the optical fibre onto the optical fibre receiver of FIG. 3. The size of the spot of light can be seen in the sectional view for the two partial diodes D1 and D2.

It should of course be clear that the figure given for the diameter is an approximate value, and that it does not necessarily have a circular shape, as its name suggests. The corresponding diagram shows in FIG. 1 and FIG. 2 a form having a number of corners which approximates largely to a circular shape but which recognises aspects of production technology relevant to optimised manufacture in integrated form.

After connecting the individual diodes D1 to D4 to their corresponding transimpedance amplifiers 20 to 23, the anode terminals of the diodes are joined to a common potential. The cathode terminals of the diodes are each independently connected to one input of the transimpedance amplifiers that electrically convert or amplify the signals, in preparation for subsequent electrical combination in the summing circuit 30. On the basis of FIG. 5, no highly electrically conductive connection is provided between anode and cathode 1 or between anode and cathode 2 of the two photodiodes D1 and D2, which means that the two connections are not joined by an electrically conductive coupling. This only changes for one of the connections of each diode after they are configured in accordance with FIG. 4.

Figure 6:
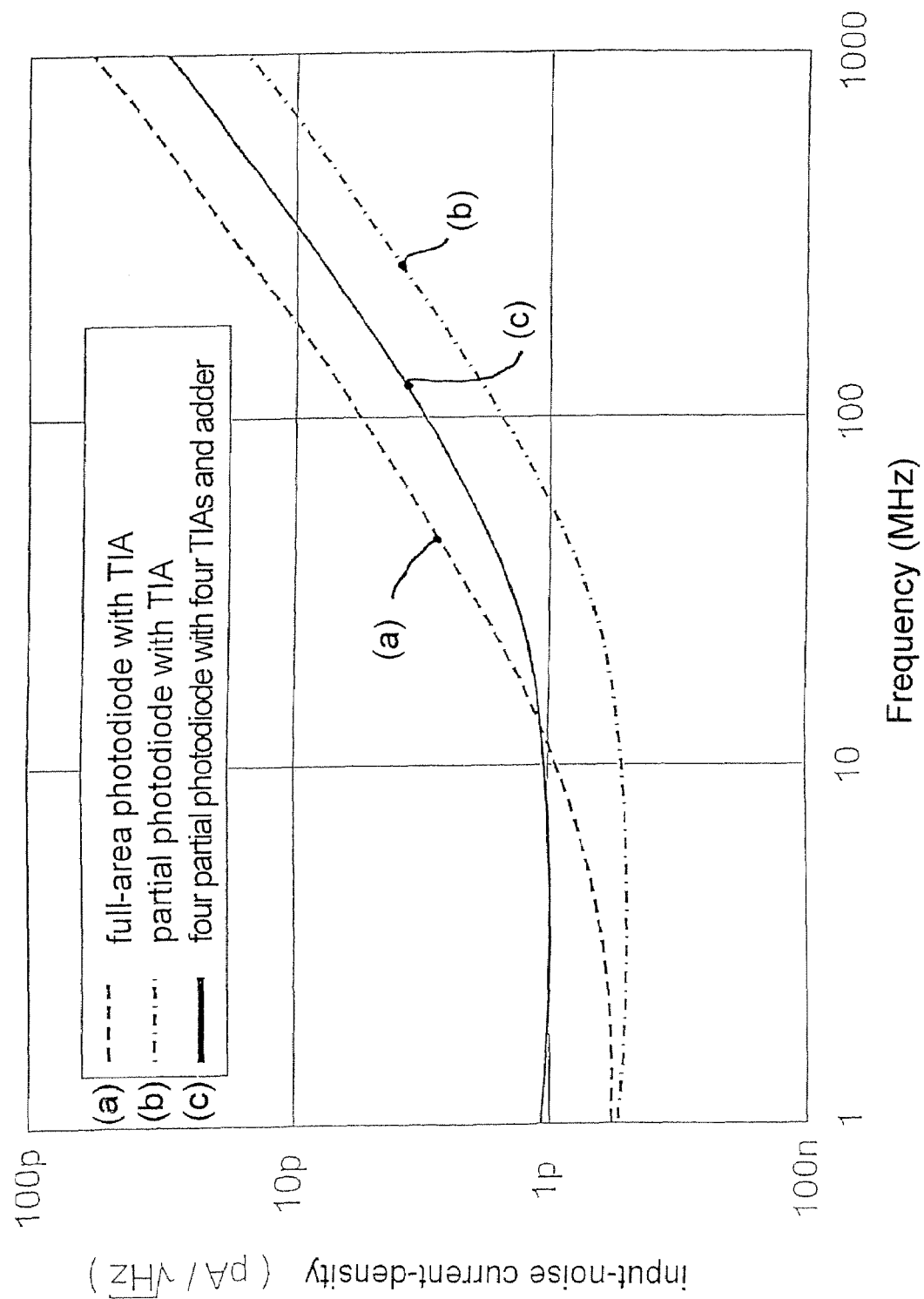
FIG. 6 is a diagram of the input noise density plotted against the frequency.

FIG. 6 compares the equivalent input noise densities of the following systems:

(a) a full-area photodiode D with one transimpedance amplifier;

(b) a partial photodiode D1 with one transimpedance amplifier and (c) four partial photo diodes, each having its own transimpedance amplifier followed by addition in summing amplifier 30.

If the input noise densities are integrated over the range 1 MHz to 150 MHz, the following values are obtained for the equivalent input noise densities: for the full-area photodiode with one transimpedance amplifier we obtain 59.3 nA, while for the four divided photo diodes 11 with four transimpedance amplifiers and a summing amplifier, the figure is 33.5 nA.

By dividing the four photodiodes, the bandwidth can be more than doubled, while the equivalent input noise current with constant bandwidth can be almost halved.

The bandwidth of the whole system, 402 MHz, is enough to process a non-return-to-zero (NRZ) data rate of 500 Mbit/s or of 622 Mbit/s.

For a photodiode with a diameter "d2" of 1 mm, the depletion layer capacitance is 8.8 pF. One of the four partial photo diodes therefore has a depletion layer capacitance of 2.2 pF. For the four equally divided photo diodes, we reach with a transimpedance of 164 kOhm a bandwidth of 116 MHz, which is sufficient for a data rate of 155 Mbit/s. If the feedback resistor Rf in the amplifiers 20 to 23 is reduced, then at a transimpedance of 32.6 kOhm a bandwidth of 413 MHz (corresponding to a data rate of 622 Mbit/s) is achieved.

These data rates can for the first time be achieved with the aid of the photodiode principle, in combination with an effective photodiode diameter of 1 mm. In this way an optoelectronic integrated circuit (OEIC) for a plastic fibre with a diameter of 1 mm can achieve a data rate of more than 500 Mbit/s.

A further possible application lies with optical receivers for glass fibres or for plastic fibres that permit a high tolerance in the adjustment of plug-in optical connectors, or which do not require adjustment.

The invention claimed is:

1. An optical fibre receiver for an opto-electronic integrated circuit (OEIC), comprising at least one photo-receiver (11) and at least one transimpedance amplifier, wherein (i) the photo-receiver (11) is divided into several partial photo-diodes (D1, D2, D3, D4) in order to consist of a number of individual photo-diodes, wherein the size of the partial photo-diodes is adapted to that of a spot of light projected onto the photo-receiver (11);

(ii) each partial photo-diode (D1, D2, D3, D4) is connected to an own transimpedance amplifier (20, 21, 22, 23), and the electrical output signals of the transimpedance amplifiers (20, 21, 22, 23) are combined electrically by a summing amplifier (30); and (iii) wherein at least the photo-receiver (11), the transimpedance amplifiers and the summing amplifier (30) are monolithic integrated onto a chip together with other circuit components.

2. The fibre receiver according to claim 1, wherein the receiver is manufactured in a CMOS technology.

3. The fibre receiver according to claim 1, wherein the receiver is manufactured in a bipolar technology.

4. The fibre receiver according to claim 1, wherein the receiver is manufactured in a BiCMOS technology.

5. The fibre receiver according to one of the preceding claims, wherein the receiver, which is an integrated component of the monolithic circuit, comprising the photo-receiver (11) having a size up to substantially 1 mm diameter (d2).

6. The fibre receiver according to claim 1, wherein the transimpedance amplifiers (20, 21, 22, 23) are provided as operational amplifier circuits.

7. The fibre receiver according to one of the claims 1 or 6, wherein the transimpedance amplifiers (20, 21, 22, 23) are wired as current-voltage converters.

8. The fibre receiver according to claim 1, wherein four partial regions (D1, D2, D3, D4) of the photo-receiver (11) are provided as separate photo-diodes having between each other an optically or electrically insensitive intermediate zone (12).

9. A method for receiving a high frequency light signal in an optical receiver (11) at an end of an optical fibre, wherein a spot of light projected by the fibre onto the optical receiver (11) falls on several individual regions (D1, D2, D3, D4) of the optical receiver (11), these regions being electrically decoupled from each other or having no essential electrical conductance to each other, wherein the size of the several individual regions is adapted to that of the spot of light, or vice versa, and wherein each electrical signal provided by each individual region is connected to an independent, high-bandwidth amplifier (20, 21, 22, 23), thereafter they are electrically combined (30).

10. The method according to claim 9, wherein the optical receiver (11) converts substantially concurrently an optical signal from the same fibre into several corresponding electrical signals by several independent photo-diodes acting as individual regions.

11. The method according to claim 9, wherein the optical fibre is a relatively thick plastic fibre.

12. The method according to one of the claims 9 or 11, wherein the spot of light is of an order of magnitude of substantially 1 mm diameter or less, but of a relatively large area.

13. The method according to one of the claims 9, 12 or 11 wherein each individual region (D1, D2, D3, D4) of the optical receiver (11) is smaller than the spot of light or than a total area of the optical receiver (11) at the end of the optical fibre.

14. The method according to claims 12, wherein each individual region (D1, D2, D3, D4) of the optical receiver (11) is smaller than the spot of light or than a total area of the optical receiver (11) at the end of the optical fibre.

* * * * *

UNITED STATES PATENT AND TRADEMARK OFFICE
CERTIFICATE OF CORRECTION

PATENT NO. : 7,282,689 B2  
APPLICATION NO. : 10/507306  
DATED : October 16, 2007  
INVENTOR(S) : Horst Zimmermann, Michael Foertsch and Holger Pless It is certified that error appears in the above-identified patent and that said Letters Patent is hereby corrected as shown below:

On the face of the patent, fields (12) and (75), in both instances, the name "Zimmerman" should read --Zimmermann--.

On the face of the patent, field (30), the foreign application priority data number "102 13 045" should read --102 13 045.0--.

In column 4, line 7 and 8, "transimpedanee" should read --transimpedance--.

Column 4, line 62 in the first line of claim 14, "claims" should read --claim--.

Signed and Sealed this

Tenth Day of February, 2009

JOHN DOLL  
*Acting Director of the United States Patent and Trademark Office*